United States Patent [19]

Lee et al.

[11] Patent Number: 5,757,060
[45] Date of Patent: May 26, 1998

[54] CONTAMINATION GUARD RING FOR SEMICONDUCTOR INTEGRATED CIRCUIT APPLICATIONS

[75] Inventors: Jin-Yuan Lee, Hsin-Chu; John Chih-Shih Wei, Taipei; Ying-Chen Chao, Hsin-Chu, all of Taiwan

[73] Assignee: Taiwan Semiconductor Manufacturing Company, Ltd., Hsin-Chu, Taiwan

[21] Appl. No.: 684,072

[22] Filed: Jul. 19, 1996

Related U.S. Application Data

[62] Division of Ser. No. 251,039, May 31, 1994, Pat. No. 5,567,643.
[51] Int. Cl.$^6$ .................................................. H01L 29/41
[52] U.S. Cl. .......................... 257/529; 257/773; 257/409
[58] Field of Search .............................. 257/529, 528, 257/773, 775, 126, 127, 409, 605

[56] References Cited

U.S. PATENT DOCUMENTS

| | | |
|---|---|---|
| 4,723,155 | 2/1988 | Uchida ................................. 257/529 |
| 5,025,300 | 6/1991 | Billig et al. ............................. 357/51 |
| 5,041,897 | 8/1991 | Machida et al. ......................... 357/51 |
| 5,235,205 | 8/1993 | Lippitt, III ............................. 257/528 |
| 5,444,012 | 8/1995 | Yoshizumi et al. ........................ 437/60 |
| 5,538,924 | 7/1996 | Chen .................................... 437/246 |
| 5,578,517 | 11/1996 | Yoo et al. ............................... 437/60 |
| 5,585,662 | 12/1996 | Ogawa .................................. 257/529 |
| 5,661,331 | 8/1997 | Hebbeker et al. ........................ 257/529 |

*Primary Examiner*—David B. Hardy
*Attorney, Agent, or Firm*—George O. Saile; Stephen B. Ackerman; William J. Stoffel

[57] ABSTRACT

The guard ring is a barrier which prevents contaminates from diffusing through a window opening through insulating layers to adjacent semiconductor devices. The guard ring is formed surrounding a window in the insulation layers over a fuse link or an alignment mark. The guard ring is an annular metal ring that penetrates two or more insulating layers and contacts the substrate.

18 Claims, 5 Drawing Sheets

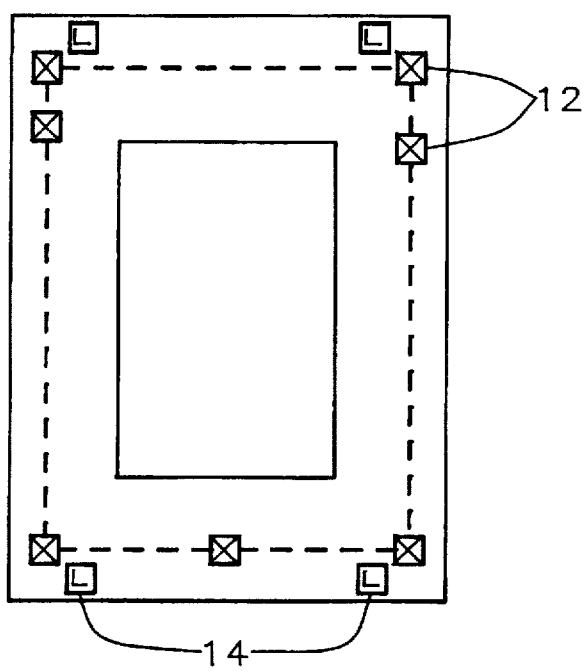
FIG. 1
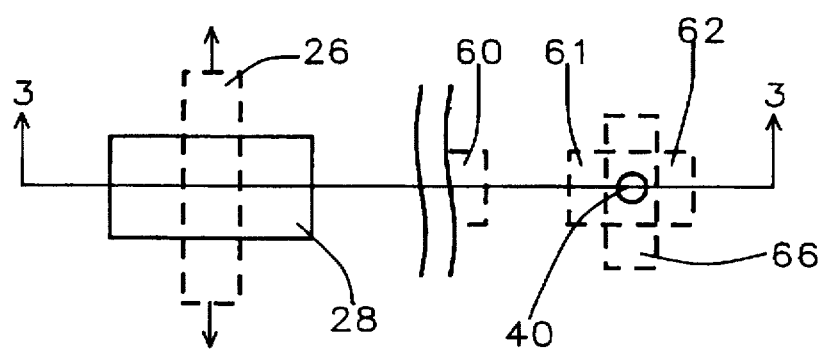
FIG. 2 – Prior Art

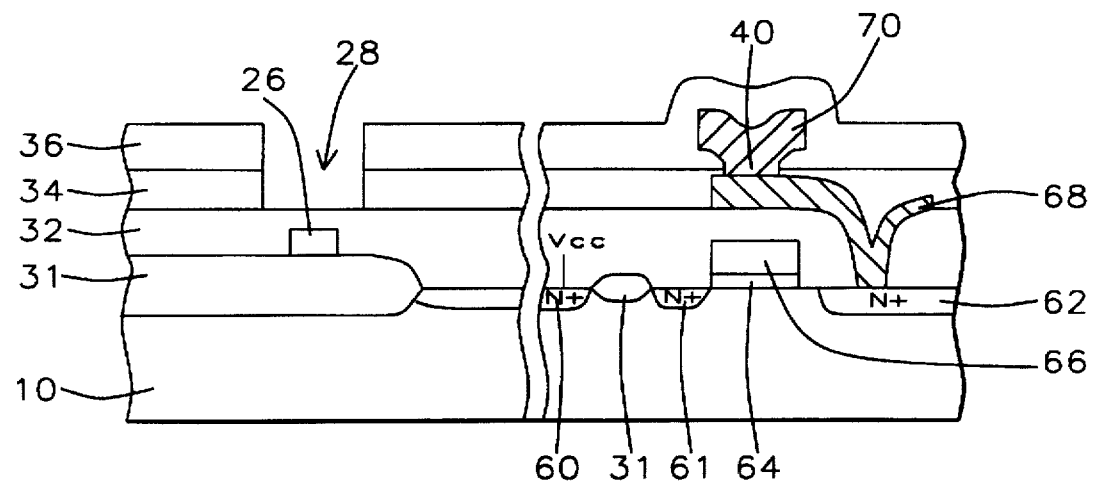
FIG. 3 - Prior Art
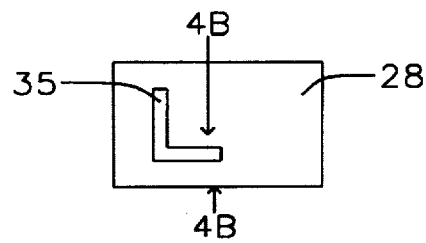
FIG. 4A - Prior Art
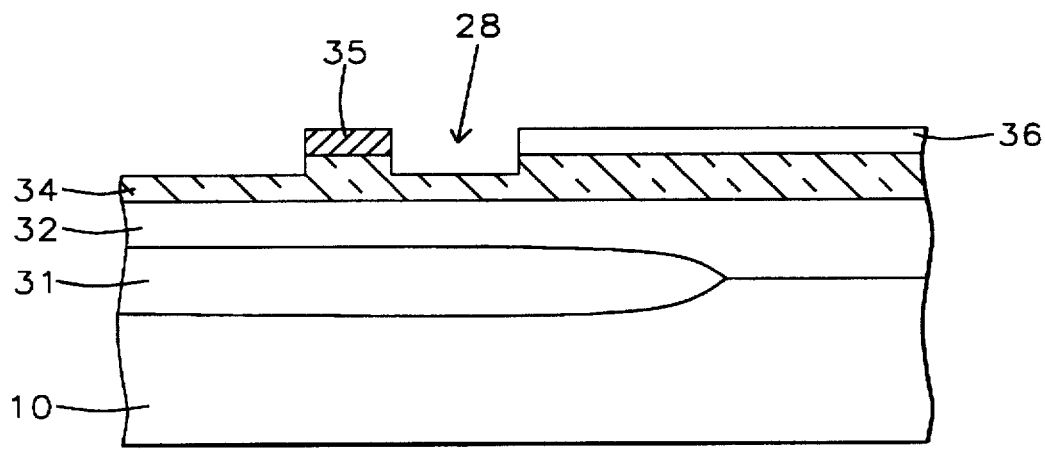
FIG. 4B - Prior Art

CONTAMINATION GUARD RING FOR SEMICONDUCTOR INTEGRATED CIRCUIT APPLICATIONS

This application is a divisional of Ser. No. 08/251,039 filed May 31, 1994, now U.S. Pat. No. 5,567,643.

BACKGROUND OF THE INVENTION

1) Field of the Invention

This invention relates to integrated circuits and semiconductor devices. It relates particularly to a structure and method for producing integrated circuits having an improved contamination guard ring for circuit redundancy applications and laser repair alignment mark applications.

2) Description of the Prior Art

Semiconductor chips often have fusible link regions and alignment mark regions, both of which frequently lower chip yields and reliability by allowing contamination to penetrate to the device regions. Integrated circuits often include fusible conductive links (fuses) that may be rendered non-conductive (i.e. blown) by the running a high current. Fuses can also be blown by applying laser energy with a laser repair machine.

In dynamic or static memory chips, defective memory cells may be replaced by blowing the fuses associated with the defective cells, and activating a spare row or column of cells. The spare cells can be activated by blowing fuses. This circuit rewiring using fusible links allows considerable enhanced yields and reduces the production costs.

Furthermore, logic circuits may also be repaired or reconfigured by blowing fuses. For example, it is common to initially fabricate a generic logic chip having a large number of interconnected logic gates. Then, in a final processing step, the chip is customized to perform a desired logic function by disconnecting the unnecessary logic elements by blowing the fuses that connect them to the desired circuitry. Still other applications of laser-blown fuses are possible.

An important challenge is to improve the reliability of the semiconductor devices surrounding fusible links and alignment mark regions, especially when a large number of these regions are on a chip. A problem with fusible link and alignment mark regions is that moisture and other contaminates can diffuse from the fuse regions into the device areas thus reducing circuit reliability and yields.

FIG. 1 shows a top plan view of a semiconductor chip with fusible links regions 12 and alignment mark regions 14. Often a chip contains alignment marks which are used to align the laser repair machine.

A conventional fusible link region and an adjacent device region is shown in FIG. 2. FIG. 3 shows a cross-sectional view of the same link and device regions taken along horizontal axis labeled 3. Fuse 26 can be formed of a metal, such as aluminum, platinum silicide or titanium tungsten, polysilicon, or a polycide, such as titanium polycide, tungsten polycide or molybdenum polycide.

Fuse 26 is normally formed over a thick field oxide regions 31 in semiconductor substrate 10. Fuse 26 is formed over the field oxide regions 31 to prevent shorting of the fuse 26 to the substrate 10 through a thinner insulating layer. Layers 32,34,36 are insulating layers, such as borophosphosilicate glass, silicon oxide and silicon nitride respectively. Opening 28 is formed over the fuse area through the insulating layers 32,34,36. Opening 28 can have a width of 5 microns and a length of 5 microns. An adjacent semiconductor device is shown with buried N+ regions 60 61 62, gate oxide 64, gate 66, via 40 and metal layers 68 70.

There are two methods for blowing fuses: a) using a laser and b) passing a high current through the fuse. Both methods require that the fuse is covered by a very thin insulation layer because this layer must be able to be penetrated and melted away by the laser. The portion of the fuse and thin insulating layer which is melted away or "blown" must not deposit or interfere with near-by devices.

A laser is often used to break the fuse forming an electrical open by heating the fuse to a high temperature. It is conventional to have an opening 28 over the fuse in the area where the fuse will be broken so that the laser heating will be more effective. Because the passivation layer would inhibit the laser, the passivation layers are normally opened to the single insulating layer covering the fuse 26. An alternative is to form a thin insulating layer over the fuse. See U.S. Pat. No. 5,825,300 discussed below. In the example shown in FIG. 3 two passivation layers are used: Silicon nitride 36 and inter-metal dielectric layer 34.

Alignment marks are used to align the laser on the correct portion of the fuse to be blown. Window openings in the passive layers are formed so that the alignment marks can be clearly viewed.

A conventional alignment mark region is shown in a top plan view in FIG. 4A and in a cross-section view along axis 4B in FIG. 4B. Alignment mark metal 35 is formed in window opening 28 on several insulation layers. The layers illustrated in FIG. 4B are: silicon oxide 31, borophosphosilicate glass 32, composite layer 34 and silicon nitride 36. Composite layer 34 can be formed of three layers: oxide, Spin on glass, oxide. A problem with the window 28 is that contamination can enter through the exposed composite layer 34 and harm nearby devices.

A major problem with any window opening in the passivation layers is that moisture and contamination can enter through the exposed insulation layers and diffuse to the semiconductor devices. The diffused moisture and contaminates can decrease reliability and yields. Moisture is present in the air and sodium (Na+ ions) are plentiful in the environment.

As shown in FIG. 3 and 4B, moisture and other contaminates can enter through the window 28 into layer 34 and diffuse to the adjacent semiconductor devices. These contaminates can diffuse through the inter-metal dielectric layer 34 to the nearby devices 31 64. Water will attack the metal via 40, with the following reaction:

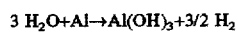

$$3\ H_2O + Al \rightarrow Al(OH)_3 + 3/2\ H_2$$

causing the resistance of metal via's 40 to increase and finally cause circuit failure.

FIG. 3 shows an opening 28, buried N+ regions 60 61 62, field oxide 31, gate oxide 64, polysilicon gate 66, and metal layers 68 70. Mobile ions, such as sodium ions, can diffuse through inter-metal dielectric layer 34, and through the insulating layer 32 into the field oxide layer 31. Mobile ions in the field oxide layer 31 can cause field inversion. The field inversion causes undesired leakage current between adjacent buried N+ (or P+) regions 60, 61. Also, mobile ions in the gate oxide 64 will cause a transistor threshold shift whereby the circuit fails.

The following three US patents show fusible link structures, but do not solve the problem of contamination diffusing through the window opening and the insulating layers.

M. Limpet, III, U.S. Pat. No. 5,235,205 discloses a method of forming a window in the insulating layer of an integrated circuit to allow laser trimming of a fusible link.

Lippett's method involves forming a thin first insulating layer over the fuse that a laser is capable of cutting through. Then forming an etch stop layer and a second thicker insulating layer over the first insulating layer. The second insulating layer and the etch stop layer are etched in a controlled manner to expose the first insulating layer overlying the fuse. This invention produces layers over fuses that are capable of being cut through. However, this invention does not solve the problem of moisture and contaminates diffusing into the passivation layer through the window.

Billig et all. U.S. Pat. No. 5,025,300 discloses a method of forming a very thin protective insulating layer over the fuse in a window. The thin insulating layer thickness that allows the laser to penetrate. Also, the thin insulating layer thickness uniformity is tightly controlled to allow consistent laser cutting from fuse to fuse. In another embodiment, the thin protective insulating layer is formed after the fuse is blown. This invention prevents shorts between conductor that otherwise might occur due to debris from the fuse-blowing operation. But this invention has tradeoffs. The extra protective layer must be removed from some device surfaces, for example, over metal bonding areas. Also, forming the extra layer and partial removal steps add cost. Furthermore, this invention is not particularly applicable to alignment mark areas where any layers over the alignment marks degrade their readability. This is particularly important when using the auto-align photolithography tools. Moreover, the problem of moisture and contaminates diffusing through the insulating layers in the window still exists.

Machida U.S. Pat. No. 5,041,897 discloses a technique whereby a window is opened in the insulating layer above the fuse. The window has the shape of the fuse thus improving the heat-radiation away from the fuse. During the application of a high current which causes the fuse to open, this improved heat radiation prevents the surrounding insulation regions from cracking. However, the problem of contaminates diffusing to the semiconductor devices through the window still exists.

SUMMARY OF THE INVENTION

It is a general object of the invention to provide an improved structure and method for forming an integrated circuit contamination guard ring.

An more specific object of the present invention is to provide an improved structure and method for forming an integrated circuit guard ring which prevents contamination from diffusing through a window opening in the insulating layer to semiconductor devices.

In accordance with the above objects, a structure and technique for forming an integrated circuit guard ring is provided. A guard ring is formed surrounding a window opening in the insulation layers over a fuse. A first insulation layer is formed on a semiconductor substrate with first split annular openings which expose the substrate surface. Next, a fuse is formed on the first insulating layer. A second insulation layer is formed over the fuse and first insulating layer. The second insulating layer has second split-annular openings on opposite sides of the fuse exposing the substrate, coinciding with the first openings. Now, a first metal layer is formed on the substrate in the first and second openings and on the second insulating layer. After this, a third insulating layer is formed overlying the first metal layer and the second insulating layer. The third insulating layer also has a third opening coinciding with the first and second openings and the first metal layer. Next, a second metal layer is formed over the first metal layer. Lastly, a fourth insulating layer is formed over the second metal layer and the third insulating layer. The third and fourth insulating layers have a window opening over a fuse.

A second embodiment of the invention discloses a guard ring that contacts the substrate and fully encloses a window region. The structure and process is similar to the first embodiment with the difference that the first, second and third openings are annular, fully enclosing the window opening.

BRIEF DESCRIPTION OF THE DRAWINGS

The drawings show the following:

FIG. 1 is a top plan view in greatly enlarged scale that illustrates a process for forming a fusible link, fuse window and adjacent semiconductor devices in accordance with the prior art process.

FIG. 2 is plan view in broken section in greatly enlarged scale that illustrates a process for forming a fusible link, fuse window and adjacent semiconductor devices in accordance with the prior art process.

FIG. 3 is cross-sectional view along axis 3 in FIG. 2, in broken section in greatly enlarged scale that illustrates a process for forming a fuse in accordance with the prior art process.

FIG. 4A is top plan view in greatly enlarged scale that illustrates a process for forming an alignment mark in accordance with the prior art process.

FIG. 4B is cross-sectional view along axis 4B in FIG. 4A, in broken section in greatly enlarged scale that illustrates a process for forming a alignment mark in accordance with the prior art process.

DETAILED DESCRIPTION OF THE PREFERRED EMBODIMENTS

The following detailed description relates to an improved structure and technique for forming guard rings for integrated circuits. The invention has two embodiments: 1) a guard ring structure formed around window opening containing a fusible link and 2) a guard ring structure completely surrounding an window opening.

The second embodiment will be discussed as applied to a guard ring around laser repair alignment marks but is equal applicable around any structure in a window opening.

The method of the present invention will be described as a guard ring around a fuse and an alignment mark and not be way of limitation. The guard ring can be applied to other structures. Moreover, the location of the fuse in this description is on the first insulating layer, but the fuse may in practice be located on any insulating layer in the integrated circuit. Furthermore, the four insulating layers are described in this invention, but in practice the actual number and composition of the layers may vary.

A. A Guard Ring Around A Window Opening Containing A Fuse

Figure 5:
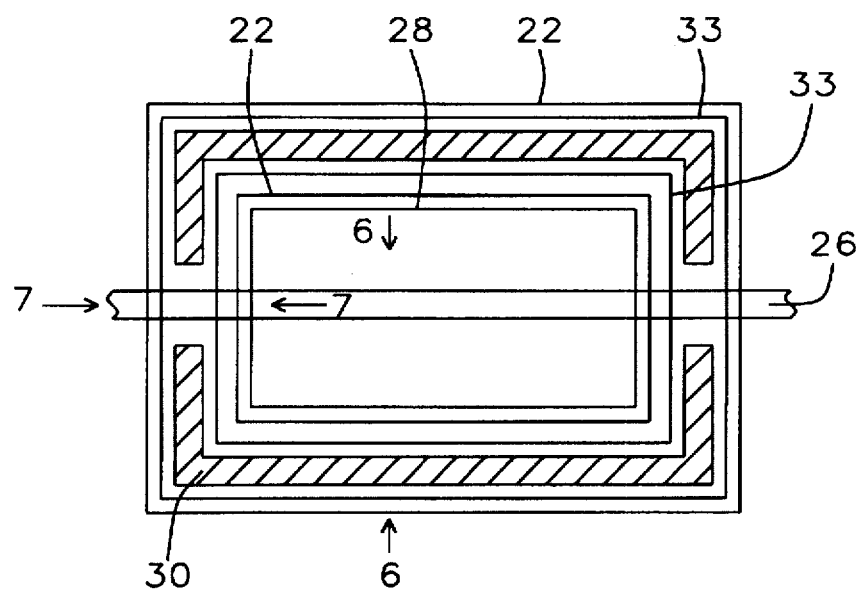
FIG. 5 is a top plan view of the guard ring of the invention surrounding a fuse link located in a window opening.
Figure 6:
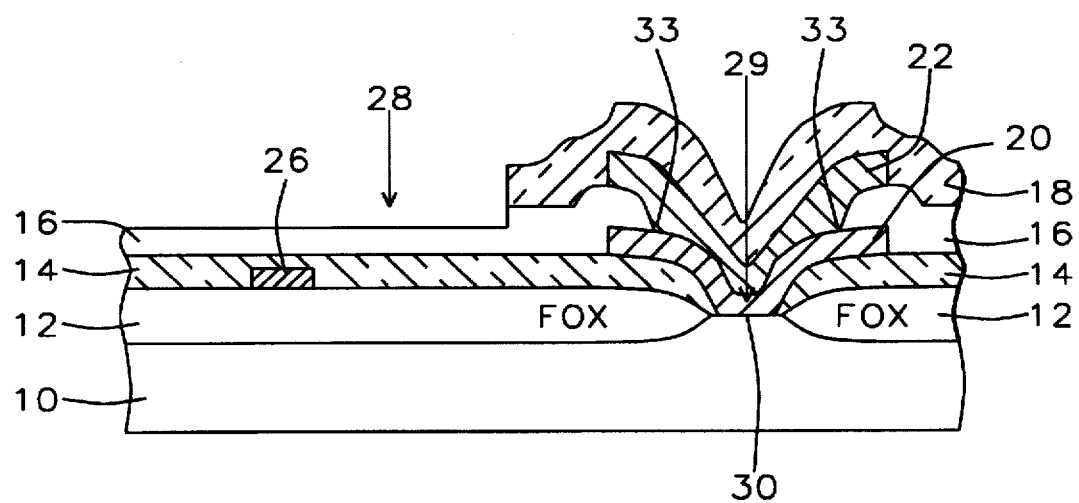
FIG. 6 is a cross-sectional view of the guard ring of the invention taken along line 6 in FIG. 5.

As shown in FIGS. 5 and 6, a first insulating layer 12 is formed over portions of the substrate 10 with first split annular openings 29 exposing the substrate surface 30. The split annular openings 29 can also be called vias. The edges 33 of the via 29 between the first and second metal layers 20 22 are also shown. The openings 29 in this and subsequent insulating layer can be formed by conventional photolithographic expose, develop, and etch processes. The first insulation layer 12 is preferably formed of thick silicon oxide, sometimes called field oxide. Silicon oxide can be grown at atmospheric pressure at 700° to 1200° C. in a wet or dry oxygen ambient in a thermal furnace. Layer 12 has a thickness in the range of 2000 to 8000 angstroms and preferably a thickness of approximately 5000 angstroms. Semi-annular hole 29 has a width in the range of 0.3 to 10.0 microns and preferably a width in the range of 0.6 microns.

Subsequently, a fusible link or fuse is formed on the first insulating layer. Fuse 26 can be formed of a metal, such as platinum silicide or titanium tungsten, or polysilicon. Also, fuse 26 can be formed of a polycide such as titanium polycide, tungsten polycide, molybdenum polycide. Fuse 26 typically has a thickness in the range of 500 to 5000 angstroms and a length in the range of 5 to 10 microns and a width in the range of 1 to 3 microns.

Next, a second insulating layer 14 is formed over the fuse 26 and the first insulating layer 12. Second insulating layer 14 has second split annular openings 29 formed over the first split annular openings 29 exposing the substrate surface 30. Second semi-annular hole 29 has a width in the range of 0.3 to 10.0 microns and preferably a width in the range of 0.6 microns. Second insulating layer 14 can be form of borophosphosilicate glass, phosphosilicate glass, silicon oxide or other suitable insulating material. Borophosphosilicate glass can be formed by low pressure chemical vapor deposition (LPCVD) of tetraethylorthosilicate (TEOS). Boron and phosphorus are added to the ambient during the formation of the borophosphosilicate glass layer. The layer is thermally treated at a temperature of 850° C. for 30 minutes to cause flow and planarization. Second insulating layer 14 can have thickness in the range of 3000 to 15,000 angstroms and preferably a thickness of approximately 6000 angstroms.

Following this, a first annular metal layer 20 is formed in the first and second openings in contact with the substrate surface 30. In the areas where the metal layer 20 passes over the fuse, the metal layer 20 is formed on the second insulating layer 14. Metal layer 20 can be formed of Al, Al alloy, tungsten, tungsten alloy, titanium alloy and combined metal layers. Metal layer 20 can be formed by sputtering at approximately 200° C., followed by evaporation by an electron gun and a chemical vapor deposition (CVD) such as Tungsten CVD with tungsten fluoride (WF$_6$ plus H$_2$ and SiH$_4$ deposited at approximately 450° C. Metal layer 20 has a thickness in the range of 2000 to 15,000 angstroms and preferably approximately 7000 angstroms, and a width in the range of 0.5 to 10 microns.

Afterwards, a third insulating layer 16 is formed overlying the first metal layer 20 and the second insulating layer 14. The third insulating layer 16 has a metal via opening 33 over the first metal layer 20 and a window opening 28 over the fuse 26. Moreover, third insulating layer 16 has a thickness in the range of 5000 to 20,000 angstroms and preferably a thickness of approximately 10,000 angstroms.

Layer 16 can be formed by making a three layer sandwich structure of a) silicon oxide, b) spin on glass and c) silicon oxide. The underlying silicon oxide layer is deposited by a plasma enhanced chemical vapor deposition (PECVD), followed by deposition of an intermediate layer of spin on glass, and followed by a top silicon oxide layer deposited by plasma enhanced chemical vapor deposition (PECVD). The bottom silicon dioxide layer can be deposited using PECVD by reacting silane and nitrous oxide in an argon plasma at 200° to 450° C. The bottom silicon dioxide layer has a thickness of approximately 2000 Angstroms. The middle spin on glass layer can be formed using a siloxane or silicate, which is deposited, baked and cured at approximately 400° C. The middle spin on glass layer has a thickness of approximately 3000 Angstroms. The top silicon oxide layer has a thickness of approximately 5000 angstroms and is formed using the same processes described above for the bottom silicon oxide layer. The overall thickness of layer 16 is in the range of 1000 to 20,000 angstroms.

Layer 16 can alternately be formed using a three layer structure. First, spin on glass is deposited and partially etched back 1000 angstroms to a thickness of 3000 angstroms. Next, silicon oxide is deposited by plasma enhanced chemical vapor deposition (PECVD) which can be etched back. The third layer can be formed of silicon oxide using TEOS or a combination of TEOS and spin on glass. The third layer can be etched back if desired.

Subsequently, a second annular metal layer 22 is formed in the second openings 29 and is in contact with the first metal layer 20. Second metal layer 22 is formed of Al, Aluminum alloy, tungsten, titanium, tungsten alloy, and titanium alloy. Metal layer 22 has a thickness in the range of 4000 to 15,000 angstroms and preferably a thickness of approximately 8000 angstroms. Metal layers 22 are defined by conventional photolithography and etch processes.

As shown in FIG. 5 and 6, a fourth insulating layer 18, having a window 28 over the fuse link, is formed overlying the first 12, second 14, and third 16 insulating layers. The window opening 28 is formed over a window area of the substrate 10. Layer 18 covers the guard ring metals 20,22. Layer 18 can be formed of silicon nitride, oxynitride or a combination of silicon oxide and nitride. Layer 18 has a thickness in the range of 3000 to 20,000 angstroms and preferably a thickness of approximately 10,000 angstroms. Silicon nitride can be formed by plasma enhanced chemical vapor deposition (PECVD) by reacting silane with ammonia or nitrogen in a glow discharge between 200° and 450° C.

Figure 7:
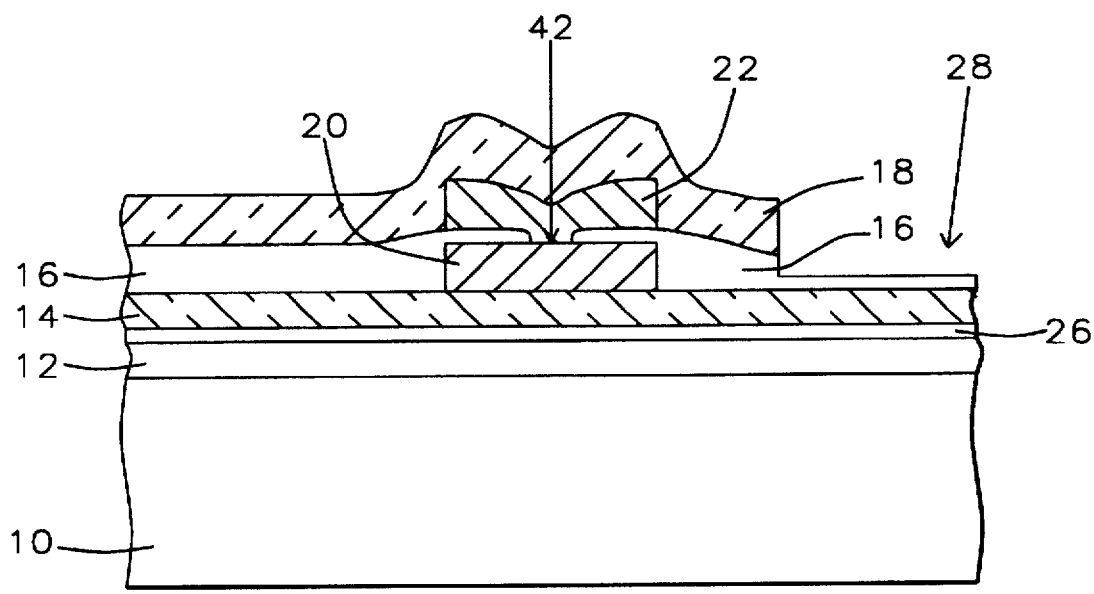
FIG. 7 is a cross-sectional view of the guard ring of the invention taken along line 7 in FIG. 5.

As shown in FIG. 5 and 7, in the areas where the guard ring passes over the fuse link 26, the guard ring 20, 22 is formed on the second isolating layer 14.

The guard ring prevents contamination from diffusing from the window openings 28 to the device areas. Referring to FIG. 6, moisture and other contaminates can diffuse into the exposed insulation layers in the fuse window 28. Once these contaminates enter, they could diffuse to nearby semiconductor devices and cause reliability and yield problems. Moreover, when a fuse 26 is blown, the fuse material is lifted away exposing the underlying first insulating layer. Contaminates can diffuse to the surrounding semiconductor devices through the first 12 (silicon oxide), second 14 (Borophososilicate glass, BPSG) and third 16 (oxide, SOG, oxide) insulating layers.

However, the contamination diffusion is stopped by the guard ring which pinches off the insulating layers 12 14 16 between the substrate 30, first metal 20, second metal 22 and the fourth insulation layer 18 (silicon nitride). The guard ring stops the contaminants from passing through. As shown in FIG. 7, even in the region where the fuse 26 passes underneath the guard ring 20, 22, 18, the contamination is impeded. The contamination diffusing through the third insulation layer 14 is blocked by the first and second metals 20, 22. Also, moisture and other contaminates diffuse slowly through the second insulating layer, in this example BPSG. This slow diffusion is due to the BPSG's high density. BPSG has to dense enough to flow at high temperature, such as 850° C. As a result, diffusion in BPSG is much slower than through CVD oxide or spin on glass layers.

Moreover, the guard ring surrounds the large majority of the window perimeter. The guard ring blocks all the moisture and contamination diffusing through the third insulating layer 18 and blocks most of the contamination diffusing through the first 14 and second 16 insulating layers. Therefore, the guard ring 20, 22 prevents most of the diffusion from reaching the device areas, thus improving device reliability and yields.

B. A Guard Ring For Alignment Marks Areas

In the second embodiment the guard ring contacts the substrate surface around the entire periphery of the window opening whereas in the first embodiment the guard ring did not contact the substrate where the guard ring passed over the fusible link. The window opening can contain any structure such as laser repair alignment marks.

Figure 8:
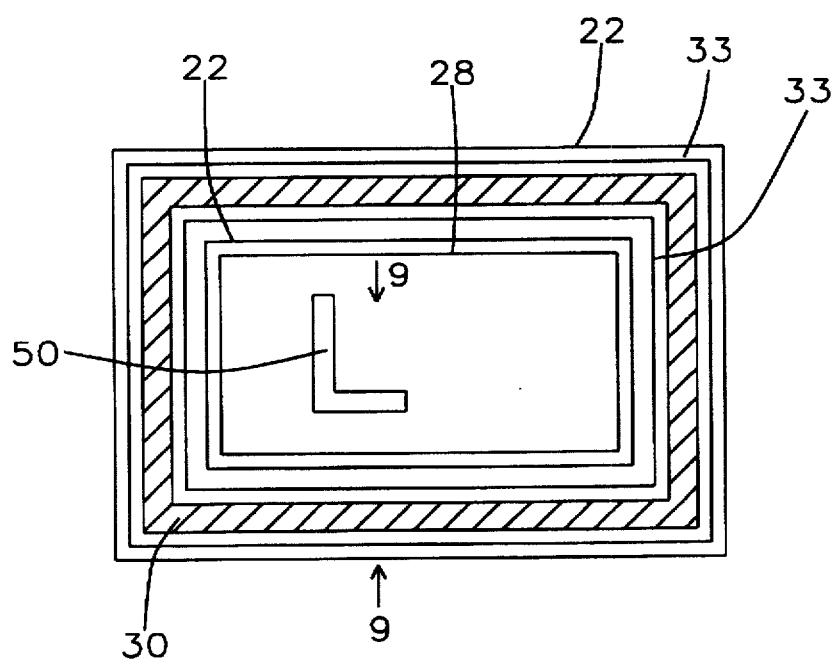
FIG. 8 is a top plan view of the guard ring of the invention surrounding a laser alignment mark located in a window opening.
Figure 9:
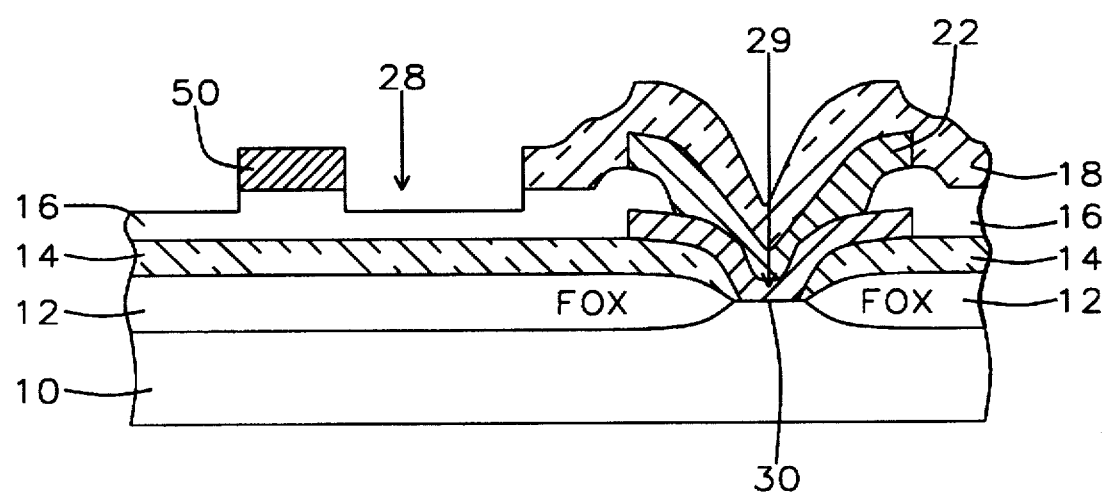
FIG. 9 is a cross-sectional view of the guard ring of the invention taken along line 9 in FIG. 8.

FIG. 8 shows a top plan view of a guard ring around an alignment mark. FIG. 9 shows a cross-sectional view of the alignment mark 50 and guard ring 20 22 taken along axis 9. The metal guard ring 20,22 fully surrounds the window opening 28 in contact with the substrate 30. The window opening 28 is formed over a window area of the substrate 10. The alignment mark 50 is formed on the third insulating layer 16 within the window 28. The processing steps are the same for the first and second embodiments with the exception of the photolithographic steps which define the openings 29 to the substrate 30. In the second embodiment the annular openings 29 exposes the substrate.

While the invention has been particularly shown and described with reference to the preferred embodiments thereof, it will be understood by those skilled in the art that various changes in form and details may be made without departing from the spirit and scope of the invention.

What is claimed is:

1. A guard ring for a semiconductor integrated circuit device that surrounds window openings and a portion of a fuse link, comprising:
   a semiconductor substrate having semiconductor devices and a window area over which a portion of a fuse link lies;
   a first insulating layer on the substrate;
   a fuse link on said first insulating layer and portions of said fuse link overlying said window area in said semiconductor substrate;
   a second insulating layer over said fuse link and said first insulating layer;
   first split annular openings through said first insulating layer and said second insulating layer, each of said split annular openings located on opposite sides of said fuse link and exposing the substrate; said first split annual openings surrounding said window area;
   a first annular metal layer in contact the substrate through said first split annular openings;
   a third insulating layer overlying said first metal layer and said second insulating layer;
   a first window opening in said third insulating layer over at least a portion of said fuse link and over said window area;
   a second annular opening, that surrounds said fusible link and said window area, through said third insulating layer and over said first split annular openings;
   a second annular metal layer in contact with said first metal layer in said second annular opening; and
   a fourth insulating layer over said second metal layer and said third insulating layer having a second window opening over the first window opening.

2. The guard ring of claim 1 wherein in the area where said first and second guard rings overlie the fuse, the first metal layer overlies the second insulating layer.

3. The guard ring of claim 1 wherein the first insulating layer is silicon oxide having a thickness in the range of 2000 to 8000 angstroms.

4. The guard ring of claim 1 wherein the second insulating layer is borophosphosilicate glass having a thickness in the range of 3000 to 15,000 angstroms.

5. The guard ring of claim 1 wherein the third insulating layer is a composite layer including silicon oxide, spin on glass, and silicon oxide having an overall thickness in the range of 1000 to 20,000 angstroms.

6. The guard ring of claim 1 wherein the fourth insulating layer is silicon nitride having a thickness in the range of 3000 to 20,000 angstroms.

7. The guard ring of claim 1 wherein said first metal layer is a metal selected from the group consisting of: aluminum, aluminum alloy, titanium, titanium alloy, tungsten, and tungsten alloy and said first metal layer, having a thickness in the range of 2000 to 15,000 angstroms.

8. The guard ring of claim 1 wherein the second metal layer is a metal selected from the group of titanium, Ti-alloy, aluminum, aluminum-alloy, tungsten and tungsten alloy, having a thickness in the range of 4000 to 15,000 angstroms.

9. The guard ring of claim 1 wherein said first and second split annular openings have a width in the range of 0.3 to 10 microns.

10. A guard ring for a semiconductor integrated circuit device that surrounds a window opening in insulating layers over a window area on a semiconductor substrate, comprising:
    a semiconductor substrate having semiconductor devices and a window area;
    a first insulating layer on the substrate;
    a second insulating layer over said first insulating layer;
    first annular openings through said first and said second insulating layers surrounding said window area;
    a first annular metal layer in contact the substrate through said annular opening;
    a third insulating layer overlying portions of said first metal layer and said second insulating layer;
    a first window opening in said third insulating layer over said window area;
    a second annular opening surrounding said first window opening through said third insulating layer and over said first annular openings;
    a second annular metal layer in contact with said first metal layer in said second annular opening;
    a fourth insulating layer over the second metal layer and said third insulating layer; and
    a second window opening over the first window opening in said fourth insulation layer.

11. The guard ring of claim 10 wherein said first window surrounds at least a laser repair alignment mark.

12. The guard ring of claim 10 wherein the first insulating layer is silicon oxide having a thickness in the range of 2000 to 8000 angstroms.

13. The guard ring of claim 10 wherein the second insulating layer is borophosphosilicate glass having a thickness in the range of 3000 to 15,000 angstroms.

14. The guard ring of claim 10 wherein the third insulating layer is a composite layer consisting of silicon oxide, spin on glass, silicon oxide having an overall thickness in the range of 1000 to 20,000 angstroms.

15. The guard ring of claim 10 wherein the fourth insulating layer is silicon nitride having a thickness in the range of 3000 to 20,000 angstroms.

16. The guard ring of claim 10 wherein the first metal layer is a metal selected from the group consisting of: titanium, Ti-alloy, aluminum, aluminum-alloy, tungsten and tungsten alloy, having a thickness in the range of 2000 to 15,000 angstroms.

17. The guard ring of claim 10 wherein the second metal layer is a metal selected from the group of titanium, Ti-alloy, aluminum, aluminum-alloy, tungsten and tungsten alloy, having a thickness in the range of 4000 to 15,000 angstroms.

18. The guard ring of claim 10 wherein said first and second split annular openings have a width in the range of 0.3 to 10 microns.

* * * * *